United States Patent [19]

Fifield et al.

[11] Patent Number: 5,341,799
[45] Date of Patent: Aug. 30, 1994

[54] URETHANE POLYMERS FOR PRINTING PLATE COMPOSITIONS

[75] Inventors: Charles C. Fifield, Landenberg, Pa.; Rudolph L. Pohl; Wako Yokoyama, both of Wilmington, Del.

[73] Assignee: Hercules Incorporated, Wilmington, Del.

[21] Appl. No.: 814,986

[22] Filed: Dec. 23, 1991

[51] Int. Cl.$^5$ .................. C08G 18/08; C08G 18/10; C08G 18/16

[52] U.S. Cl. .................... 528/49; 528/48; 528/65; 528/66; 528/75; 528/76; 528/85; 528/271; 528/272; 430/284

[58] Field of Search ............ 528/49, 48, 65, 66, 528/75, 76, 85, 271, 272; 430/284

[56] References Cited

U.S. PATENT DOCUMENTS

| | | | |
|---|---|---|---|
| 3,989,609 | 11/1976 | Brack | 204/159.15 |
| 4,153,778 | 5/1979 | Park et al. | 528/76 |
| 4,198,238 | 4/1980 | Scheve | 430/286 |
| 4,358,354 | 11/1992 | Iida et al. | 204/159.15 |
| 4,391,686 | 7/1983 | Miller et al. | 522/96 |
| 4,753,860 | 6/1988 | Hung et al. | 430/18 |
| 4,837,126 | 6/1989 | Lin | 430/284 |
| 4,849,321 | 7/1989 | Hung et al. | 430/284 |
| 5,089,376 | 2/1992 | Setthachayanon | 430/284 |
| 5,102,774 | 4/1992 | Setthachayanon | 430/284 |

FOREIGN PATENT DOCUMENTS 2607820 6/1988 France .
61-168610 7/1986 Japan .

*Primary Examiner*—John Kight, III
*Assistant Examiner*—Duc Truong
*Attorney, Agent, or Firm*—Joanne W. Patterson

[57] ABSTRACT

A urethane polymer having free acidic groups on the backbone of the polymer and terminal (meth)acrylate groups is prepared by (1) reacting a mixture comprising an aliphatic diol and a diol having acidic functionality with an excess of an aliphatic, cycloaliphatic or aromatic diisocyanate in the presence of a catalyst to produce an isocyanate-terminated urethane polymer and (2) reacting the terminal isocyanate groups of the product of step (1) with a mono- or dihydroxy (meth)acrylate. The diol comprises greater than 50% of the reaction mixture, based on the total weight of reactants. The polymer can be used in photopolymerizable compositions for making low tack flexographic printing plates and photopolymer masters.

26 Claims, No Drawings

URETHANE POLYMERS FOR PRINTING PLATE COMPOSITIONS

FIELD OF THE INVENTION

This invention relates to urethane polymers for use in photocurable printing plate compositions and a process for preparing these polymers.

BACKGROUND OF THE INVENTION

The use of various photopolymer resin compositions to make printing plates is known. For example, U.S. Pat. No. 4,358,354 describes a urethane photosensitive resinous composition comprising (a) at least one urethane prepolymer having carboxyl groups and acrylic residues only at the terminals of the molecule, (b) an ethylenically unsaturated compound and (c) a photopolymerization initiator. The composition provides letterpress printing plates that are substantially free of surface tack and have good resistance to moisture and to abrasion and wear.

However, there is still a need for improved photopolymer resin compositions that eliminate surface tack and improve plate washout and suspension of the washed out polymer in the developing bath.

SUMMARY OF THE INVENTION

The urethane polymer of this invention comprises at least one aliphatic diol residue and a diol residue having acidic functionality linked through urethane bonds and having (meth)acrylate residues only at the terminals of the polymer.

Also according to the invention, the polymer is prepared by (1) reacting a mixture of at least one aliphatic diol and a dihydroxy compound having acidic functionality with an excess of an aliphatic, cycloaliphatic or aromatic diisocyanate in the presence of a catalyst to produce an isocyanate-terminated urethane polymer having free acidic groups on the polymer backbone, and (2) reacting the terminal isocyanate groups of the product of step (1) with a mono- or dihydroxy (meth)acrylate.

The polymer can be used in photopolymerizable compositions for making low tack printing plates and photopolymer masters.

DETAILED DESCRIPTION OF THE INVENTION

The mixture of diols used in step (1) of the process of this invention includes at least one aliphatic diol, preferably one having a weight average molecular weight of 1000 to 4000. A mixture of two different aliphatic diols is preferred. Suitable aliphatic diols include polyethylene glycol; polypropylene glycol; a block copolymer made by reacting a propylene oxide polymer with ethylene oxide; polytetrahydrofuran diol; polypropylene adipate diol; neopentyl glycol adipate diol; 1,4-butanediol ethylene glycol adipate diol; 1,6-hexanediol phthalate adipate neopentyl glycol phthalate adipate diol and ethylene glycol adipate diol.

The mixture of diols also includes dihydroxy compounds having acidic functionality. A compound having acidic functionality is defined as any compound having an acidity greater than five. Suitable compounds include, for example, bis-hydroxymethylpropionic acid; 2,3-dihydroxybutanoic acid; 2,4-dihydroxy-3,3-dimethylbutanoic acid; 2,3-dihydroxyhexadecanoic acid; dihydroxybutenoic acid; tartaric acid; 2,3-dihydroxy-2-methylpropionic acid, and bis(hydroxyethyl)glycine. Bis-hydroxymethylpropionic acid is preferred. The concentration of dihydroxy compound having acidic functionality can be varied from 0.2% to 30%. From 2% to 5% is preferred. In this specification, all percentages are by weight, based on the total weight of the components used to prepare the urethane polymer.

The mixture of diols is reacted with an excess of an aliphatic, cycloaliphatic or aromatic diisocyanate. Suitable diisocyanates include, for example, 2,4- or 2,6-toluene diisocyanate; isophorone diisocyanate; 1,6-hexamethylene diisocyanate; 2,2,4-trimethylhexamethylene-1,6-diisocyanate; p,p'-methylene-bisphenylisocyanate or mixtures thereof.

The equivalent hydroxyl to isocyanate ratio for the reaction can vary from 1:1.1 to 1:2.0. A ratio of 1:1.4 is preferred. The reaction temperature is preferably from 40° C. to 90° C., most preferably from 70° C. to 80° C. The reaction is preferably carried out in the presence of 50 to 300 ppm of an organic tin compound or from 0.1 to 3% of an aliphatic amine compound as a catalyst. Suitable catalysts include, for example, dioctyltin bis-(isooctylmercaptoacetate), dibutyltin dilaurate, dibutyltin diisooctylmaleate, triethylenediamine, triethanolamine and triethylamine. Dioctyltin bis(isooctylmercaptoacetate) is preferred. The polyether urethane polymer that is formed is characterized by the presence of free acidic groups on the backbone of the polymer and isocyanate groups at the ends of the polymer chain. The presence of the free acidic groups improves plate washout and suspension of the washed out urethane polymer in the alkaline washout bath.

In the second step of the reaction, the product from step (1) is reacted with a mono- or dihydroxy (meth)acrylate in an amount sufficient to react with the isocyanate groups at the ends of the polymer chain. The term "(meth)acrylate" indicates that both acrylates and methacrylates can be used. From 0.2 to 10 equivalents of excess hydroxy-functional (meth) acrylate are preferred. Suitable (meth) acrylates include, for example, 2-hydroxypropyl (meth) acrylate, butanediol mono (meth) acrylate, polyethylene glycol (10–20 moles ethylene oxide) mono(meth)acrylate, polypropylene glycol (5–20 moles propylene oxide) mono(meth)acrylate, glycerol mono(meth)acrylate, and hydroxyethyl (meth)acrylate. An organic tin compound or an aliphatic amine compound of the types and amounts specified above can be used as a catalyst for this reaction if desired. The resulting urethane polymer is a liquid, has (meth)acrylate groups on the ends of the polymer chain, free acidic groups on the polymer backbone and an acid number of 1 to 150.

The urethane polymers can then be blended with ethylenically unsaturated monomers, photoinitiators and stabilizers to produce a curable composition that is sensitive to actinic radiation and can be used to produce low tack or tack-free printing plates and photopolymer masters. The amount of urethane polymer present in the composition is from about 35% to about 85%, based on the total weight of the composition.

The ethylenically unsaturated monomers are typically present in an amount of 10–50% by weight, based on the total weight of the composition. Suitable monomers include, for example, vinylpyridine; N-vinylcarbazole; acrylic acid and methacrylic acid and esters thereof having as the ester-forming group an alkyl, cycloalkyl, tetrahydrofurfuryl, allyl, glycidyl or hydroxyalkyl group; mono- or di(meth)acrylates of an alkylene glycol or a polyoxyalkylene glycol; mono-, di- or tri(meth)acrylates of trimethylolpropane; mono-, di-, tri- or tetra (meth) acrylates of pentaerythritol; acrylamide amd methacrylamide, and derivatives thereof such as N-hydroxymethyl(meth)acrylamide, N, N'-alkylene-bis- (meth) acrylamides, diacetone (meth)acrylamide; aromatic vinyl compounds such as styrene, vinyltoluene and divinylbenzene; allyl compounds such as diallyl phthalate and triallyl cyanurate; vinyl acetate; acrylonitrile; itaconic acid, fumaric acid, maleic acid and maleic anhydride, and mono- or di-esters thereof having as the ester-forming group one or two alkyl groups; unsaturated polyester or alkyd resins; and unsaturated urethane resins, for example, those urethane resins modified with an addition polymerizable monomer with active hydrogen such as a hydroxyalkyl (meth)acrylate. The terms "alkyl" or "alkylene" are meant to include those groups having a straight or branched chain of 1–20 carbon atoms. The term "cycloalkyl" is meant to include those groups having 3–20 carbon atoms and at least one 3- to 8-membered ring, unsubstituted or substituted with alkyl, halogen or phenyl. Methacrylic acid esters are preferred.

Various known photosensitizers can be used, either alone or in combination, as the photopolymerization initiator. Suitable photosensitizers include, for example, 2,2-dimethoxyphenylacetophenone, benzoin isobutyl ether and other benzoin-type ethers. The initiator is typically present in an amount of 0.1 to 2.0% by weight, based on the total weight of the composition.

A stabilizer or combination of stabilizers can also be added to the composition to prevent premature polymerization. Suitable stabilizers include, for example, butylated hydroxytoluene and the monomethyl ether of hydroquinone. The stabilizer is typically present in an amount of 0.01 to 0.3% by weight, based on the total weight of the composition.

To produce printing plates, the liquid composition is exposed to ultraviolet radiation through a negative to initiate curing in the exposed areas, and the unexposed portion is washed away with an aqueous alkaline detergent solution. The developing bath typically contains 0.5–2% of an anionic detergent together with a water softener and a defoamer. The plate is then exposed to ultraviolet radiation in air. Production of 150 to 250 plates per hour can be achieved in this manner.

EXAMPLE 1

A urethane polymer is made from the following charge according to the process of this invention:

|  | Eq. Wt. | Wt. % | Equiv. |
|---|---|---|---|
| Poly G 55-53 | 995 | 29.28 | 0.0294 |
| Poly G 20-56 | 996 | 42.63 | 0.0428 |
| Bis-hydroxymethyl propionic acid | 67 | 2.37 | 0.0353 |
| Toluene diisocyanate | 87.1 | 14.07 | 0.1615 |
| 2-Hydroxypropyl methacrylate | 144 | 3.88 | 0.0269 |
|  |  | 99.99 |  |

The Poly G 55-53, Poly G 20-56, and bis-hydroxymethylpropionic acid are dried under a nitrogen purge for 12 hours at approximately 60° C. Poly G 20-56 is polypropylene glycol and Poly G 55-53 is a block copolymer made by reacting ethylene oxide with a propylene oxide polymer. Both have a weight average molecular weight of about 2000 and are available from Olin Chemical Co. Dioctyltin bis(isooctylmercaptoacetate) catalyst (0.015%) is added, followed by the toluene diisocyanate. The reaction mixture, still under nitrogen, is heated to 75° to 80° C. Samples are taken for isocyanate analysis. At 1.8% isocyanate, the 2-hydroxypropyl methacrylate containing 0.10% butylated hydroxytoluene (BHT) as a stabilizer and 0.015% of the same tin catalyst are added under an air atmosphere. The final product has an acid number of 10.2.

EXAMPLE 2

A urethane polymer is prepared as follows. Poly G 55-53 (37.01 g), 53.88 g Poly G 20-56 and 2.00 g tartaric acid are dried under a nitrogen purge overnight at approximately 60° C. The mixture is cooled to approximately 45° to 50° C. and 0.015 wt. % dioctyltin bis-(isooctylmercaptoacetate) catalyst is added. Toluene diisocyanate (13.36 g) is added in ⅓ increments at 45° to 50° C. After 30 minutes the reaction mixture, still under nitrogen, is heated to 70° C. The OH/NCO equivalent ratio is 1:1.3. Samples are taken for isocyanate analysis. At 1.5 to 2.0% isocyanate, 7.65 g 2-hydroxypropyl methacrylate containing 0.015 wt. % of the same tin catalyst and 0.10 wt. % butylated hydroxytoluene as a stabilizer are added under an air atmosphere. The temperature is then raised to approximately 75° C. until the % NCO is less than 0.1 to 0.3%. The final product has an acid number of 18.

EXAMPLE 3

A urethane polymer is made from the following charge:

|  | Eq. Wt. | Wt. % |
|---|---|---|
| Polypropylene glycol adipate diol | 2000 | 27.8 |
| Poly(propylene oxide) end-capped with ethylene oxide | 1700 | 27.8 |
| Bis-hydroxymethyl propionic acid | 67 | 1.2 |
| Toluene diisocyanate | 87.1 | 6.6 |
| Poly(propylene glycol) monomethacrylate | 370 | 36.6 |
|  |  | 100.0 |

The polypropylene glycol adipate diol, propylene oxide/ethylene oxide polymer and bis(hydroxymethyl) propionic acid are reacted with toluene diisocyanate in the presence of 0,015% dioctyltin bis(isooctylmercaptoacetate) catalyst at 70° to 80° C. until 65% of the toluene diisocyanate has reacted. Polypropylene glycol monomethacrylate containing 0.2 wt. % BHT and 0,015% of the same catalyst are added. The reaction is continued until the isocyanate content is less than 0.1%.

EXAMPLE 4

The following formulations are used for the preparation of a two-layer printing plate and are designated as the "base resin" formulation and the "cap resin" formulation:

|  | Wt. % |
|---|---|
| Cap Resin |  |
| Urethane polymer (Example 1) | 65.0 |
| 2-Phenoxymethyl methacrylate | 10.0 |
| Lauryl methacrylate | 17.3 |
| Tetraethylene glycol dimethacrylate | 5.0 |
| Trimethylolpropane trimethacrylate | 2.0 |
| 2,2-Dimethoxyphenylacetophenone | 0.5 |
| Butylated hydroxytoluene | 0.2 |
|  | 100.0 |

-continued

| | Wt. % |
|---|---|
| Base Resin | |
| Urethane polymer (Example 1) | 65.0 |
| 2-Phenoxyethyl methacrylate | 10.0 |
| Lauryl methacrylate | 15.3 |
| Tetraethylene glycol dimethacrylate | 5.0 |
| Trimethylolpropane trimethacrylate | 2.0 |
| 2,2-Dimethoxyphenylacetophenone | 2.5 |
| Butylated hydroxytoluene | 0.2 |
| | 100.0 |

EXAMPLE 5

The following formulations are used to prepare a two-layer printing plate.

| | Base Resin (wt. %) | Cap Resin (wt. %) |
|---|---|---|
| Urethane polymer (Example 1) | 73.55 | 73.3 |
| Isobornyl methacrylate | 14.0 | 14.0 |
| Neopentyl glycol diacrylate | 0 | 1.0 |
| Propoxylated glycerol triacrylate | 0 | 2.0 |
| Dipentaerythritol monohydroxy pentaacrylate | 0 | 0.5 |
| Tetraethyleneglycol monomethyl monomethacrylate | 5.0 | 4.5 |
| Diethylaminoethyl methacrylate | 2.0 | 2.0 |
| Dimethoxyphenyl acetophenone | 2.25 | 0.5 |
| Butylated hydroxytoluene | 0.2 | 0.2 |
| o-Benzoylbenzoic acid methyl ester | 0 | 2.0 |
| Tetraethylene glycol monomethyl monomethacrylate | 3.0 | 0 |
| | 100.0 | 100.0 |

The formulations are processed through a MERIGRAPH® SR-Y plate maker (Hercules Incorporated) at 215 plates/hour. The plate maker includes a plate exposure unit, a plate washout system for aqueous developing and a postexposure unit. The plates have low tack and are processable through a semi-automatic trim and bender machine supplied by K&F Printing Systems International. About 35,000 impressions of a 64 page edition consisting of old newspaper headlines are printed successfully. No solids build-up or fill-in are observed.

EXAMPLE 6

In this example the urethane polymer of this invention is used to prepare a photopolymer master. The following components are stirred together for three hours at 300 rpm:

| | Wt. % |
|---|---|
| Urethane polymer (Example 1) | 84.49 |
| Diethylene glycol dimethacrylate | 11.93 |
| Trimethylolpropane triacrylate | 2.98 |
| 2,2-Dimethoxy-2-phenylacetophenone | 0.50 |
| 2,6-Di-tert. butyl-4-methylphenol | 0.10 |

The solution is placed in an oven at 40° C. overnight to debubble. The solution is then poured onto a polypropylene cover sheet with the art work beneath it, covered with a polyester coversheet, and exposed from both sides on a UV exposure unit. The unexposed portions of the solution are washed away with an aqueous detergent solution to give a plate approximately 0.250 inches in thickness with a 0.100 inch relief. The plate is filled with phenolic molding powder and a phenolic-impregnated matrix board is laid on top. The plate is then placed in a press with the appropriate bearer bars and held for 8–10 minutes at 300° F. with approximately 10 tons of pressure. Upon cooling, a good quality phenolic impression is removed from the photopolymer master.

What is claimed is:

1. A urethane polymer comprising the reaction product of (a) an isocyanate-terminated urethane polymer that is the reaction product of a mixture comprising an aliphatic diol, a diol having acidic functionality and an excess of an aliphatic, cycloaliphatic or aromatic diisocyanate and (b) a mono- or dihydroxy (meth)acrylate, said aliphatic diol comprising greater than 50% of the reaction mixture, based on the total weight of reactants, and said polymer having free acidic groups only on the polymer backbone and (meth)acrylate residues only at the terminals of the polymer.

2. The polymer of claim 1, wherein at least two different aliphatic diols are present in the mixture in (a).

3. The polymer of claim 2, wherein the aliphatic diols are a mixture of polypropylene glycol and a block copolymer of polypropylene oxide and ethylene oxide.

4. The polymer of claim 1, wherein the diol having acidic functionality is bishydroxymethylpropionic acid.

5. The polymer of claim 1, wherein the (meth)acrylate is 2-hydroxypropyl methacrylate.

6. A process for preparing a urethane polymer having free carboxyl groups on the polymer backbone and terminal (meth)acrylate groups comprising (1) reacting a mixture comprising an aliphatic diol, a diol having acidic functionality and an excess of an aliphatic, cycloaliphatic or aromatic diisocyanate in the presence of a catalyst to produce an isocyanate-terminated urethane polymer having free acidic groups on the polymer backbone and (2) reacting the terminal isocyanate groups of the product of step (1) with a mono- or dihydroxy (meth)acrylate, said aliphatic diol comprising greater than 50% of the reaction mixture, based on the total weight of reactants.

7. The process of claim 6, wherein two different aliphatic diols are used in step (1).

8. The process of claim 7, wherein the aliphatic diol is a mixture of polypropylene glycol and a block copolymer of polypropylene oxide and ethylene oxide.

9. The process of claim 6, wherein the diol having acidic functionality is bis-hydroxymethylpropionic acid.

10. The process of claim 6, wherein the diisocyanate is toluene diisocyanate.

11. The process of claim 6, wherein the hydroxy (meth)acrylate is 2-hydroxypropyl methacrylate.

12. The process of claim 6, wherein the catalyst is an organic tin compound.

13. The process of claim 12, wherein the tin compound is dioctyltin bis(isooctylmercaptoacetate).

14. The process of claim 12, wherein the catalyst is present in an amount of 50 to 300 ppm.

15. The process of claim 6, wherein the catalyst is an aliphatic amine compound.

16. The process of claim 15, wherein the catalyst is present in an amount of 0.1% to 3% by weight, based on the total charge of the components used to prepare the urethane polymer.

17. The process of claim 6, wherein the ratio of hydroxyl to isocyanate equivalents in step (1) is 1:1.1 to 1:2.0.

18. The process of claim 17, wherein the ratio of hydroxyl to isocyanate equivalents in step (1) is 1:1.4.

19. A composition comprising (a) the urethane polymer of claim 1, (b) an ethylenically unsaturated monomer, and (c) a photopolymerization initiator.

20. The composition of claim 19 wherein (a) is present in an amount of about 35% to about 85%, (b) is present in an amount of about 10% to about 50% and (c) is present in an amount of 0.1% to about 2%, based on the total weight of the composition.

21. The composition of claim 19 which additionally comprises a stabilizer to prevent premature polymerization.

22. A printing plate prepared by curing the composition of claim 19.

23. A photopolymer master prepared by curing the composition of claim 19.

24. The urethane polymer prepared by the process of claim 6.

25. The polymer of claim 1, wherein the amount of aliphatic polyol is greater than 70% by weight.

26. The process of claim 6, wherein the amount of aliphatic polyol is greater than 70% by weight.

* * * * *